United States Patent
Zhu

(10) Patent No.: US 11,877,497 B2
(45) Date of Patent: Jan. 16, 2024

(54) ORGANIC LIGHT EMITTING DIODE (OLED) DISPLAY SCREEN INCLUDING A FLEXIBLE DISPLAY MODULE AND METHOD FOR MANUFACTURING SAME

(71) Applicant: WUHAN CHINA STAR OPTOELECTRONICS SEMICONDUCTOR DISPLAY TECHNOLOGY CO., LTD., Hubei (CN)

(72) Inventor: Zhitao Zhu, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 523 days.

(21) Appl. No.: 17/054,702

(22) PCT Filed: Jun. 15, 2020

(86) PCT No.: PCT/CN2020/096145
§ 371 (c)(1),
(2) Date: Nov. 11, 2020

(87) PCT Pub. No.: WO2021/217809
PCT Pub. Date: Nov. 4, 2021

(65) Prior Publication Data
US 2022/0190304 A1 Jun. 16, 2022

(30) Foreign Application Priority Data

Apr. 26, 2020 (CN) .......................... 202010340748.1

(51) Int. Cl.
*H10K 71/00* (2023.01)
*H10K 59/40* (2023.01)
(Continued)

(52) U.S. Cl.
CPC ............. *H10K 71/00* (2023.02); *H10K 59/40* (2023.02); *H10K 59/1201* (2023.02); *H10K 2102/311* (2023.02)

(58) Field of Classification Search
CPC .... H10K 71/00; H10K 59/40; H10K 59/1201; H10K 2102/311; H10K 85/324;
(Continued)

(56) References Cited

U.S. PATENT DOCUMENTS

| 2015/0177789 | A1  | 6/2015 | Jinbo | |
| 2020/0235334 | A1* | 7/2020 | Lee | H10K 50/844 |
| 2021/0132724 | A1* | 5/2021 | Kwon | G06F 3/0443 |

FOREIGN PATENT DOCUMENTS

| CN | 106504645 A | 3/2017 |
| CN | 106782091 A | 5/2017 |

(Continued)

*Primary Examiner* — J. E. Schoenholtz

(57) ABSTRACT

An OLED display screen and a method for manufacturing the same are provided. The OLED display screen includes a first substrate; a fastener disposed on a side of a surface of the first substrate; a second substrate disposed on a surface of the fastener far away from the first substrate; and a flexible display module extending and bent from a surface of the first substrate far away from the fastener to a surface of the second substrate far away from the fastener, wherein a gap without a filler is provided between the flexible display module and the fastener.

9 Claims, 3 Drawing Sheets

(51) Int. Cl.
*H10K 59/12* (2023.01)
*H10K 102/00* (2023.01)

(58) Field of Classification Search
CPC .... H10K 59/00; H10K 50/868; G06F 3/0412; G09F 9/301; G09F 9/33
See application file for complete search history.

(56) References Cited

FOREIGN PATENT DOCUMENTS

| | | | |
|---|---|---|---|
| CN | 107482040 | A | 12/2017 |
| CN | 108052233 | A | 5/2018 |
| CN | 109377883 | A | 2/2019 |
| CN | 109448569 | A | 3/2019 |
| CN | 110021236 | A | 7/2019 |
| CN | 110212089 | A | 9/2019 |
| CN | 110660323 | A | 1/2020 |
| CN | 110660327 | A | 1/2020 |
| CN | 110718159 | A | 1/2020 |
| CN | 10827680 | A | 2/2020 |
| CN | 111063256 | A | 4/2020 |

* cited by examiner

ORGANIC LIGHT EMITTING DIODE (OLED) DISPLAY SCREEN INCLUDING A FLEXIBLE DISPLAY MODULE AND METHOD FOR MANUFACTURING SAME

BACKGROUND OF INVENTION

Field of Invention

The present application relates to the field of display technology, and particularly to an organic light emitting diode (OLED) display screen and a method for manufacturing the OLED display screen.

Description of Prior Art

With widespread application of OLED technology in display panel industry, a biggest advantage of OLED products lies in their flexible and foldable characteristics.

At present, a pad bending technology of display screens is made into a large-sized R arc with a radius of 0.3-0.5 mm, which can effectively increase screen ratio of displays.

After a display panel undergoes laser lift off (LLO), a pad bending region is protected itself by an MLC dispensing process. Generally, a thickness of glue in the pad bending region is 50-80 μm, but there will be uneven thickness after the liquid glue is cured, resulting in a gap between the glue and a film layer, which causes various display defects to appear in the subsequent display panel after bending. Specifically, when the glue thickness is uneven, it is easy to affect a shape of the pad bending. For example, when the glue in the bending region is too thick, the glue interferes with other parts in the bending region, which may even cause wave warping in the bending region.

The glue process is employed in the entire pad bending region. A touch flexible printed circuit board (TP FPC) position must cross a glue region. This position will be affected by the problem of glue flatness and make a touch panel with an uneven surface. The uneven glue affects user's visual experience of full flexible dynamic bending (DF) products, and affects quality of the display screen.

In addition, during a transportation process, due to the uneven thickness of the glue in the bending region, a circuit of an array substrate is not completely fixed and is easy to be pulled, which may cause damage to the circuit of the array substrate.

SUMMARY OF INVENTION

The purpose of the present application is to provide an OLED display screen and a method for manufacturing the same to solve a problem of uneven thickness of the glue of the existing OLED display panel after dispensing, which affects a shape of the pad bending, and is prone to interference, wave warping, and the circuit of the substrate is prone to a technical problems of disconnection.

In order to achieve the above purpose, the present application provides an OLED display screen, which includes a first substrate, a fastener, a second substrate and a flexible display module; the fastener is disposed on a side of a surface of the first substrate; the second substrate is disposed on a surface of the fastener far away from the first substrate; the flexible display module extends and is bent from a surface of the first substrate far away from the fastener to a surface of the second substrate far away from the fastener, and a gap without a filler is provided between the flexible display module and the fastener.

Furtherly, the flexible display module includes a display panel and a touch panel, the display panel is disposed on the first substrate, and bent and extending to a bottom surface of the second substrate; the touch panel is disposed on a surface of the display panel far away from the second substrate; and at a side of the fastener far away from the first substrate, the touch panel partially covers the display panel to expose a side of the display panel.

Furtherly, a thickness of the touch panel is 25-60 μm.

Furtherly, the OLED display screen further includes a polarizer disposed on the flexible display module; and a length of the polarizer is less than a length of the flexible display module.

Furtherly, the touch panel includes a capacitance region coved by the polarizer; and a drive signal circuit region bent and extending below the second substrate.

Furtherly, the OLED display screen further includes an optically clear adhesive disposed on a surface of the polarizer far away from the second substrate; and a cover plate covering a surface of the optically clear adhesive far away from the second substrate.

Furtherly, an edge of the second substrate is aligned with an edge of the fastener.

In order to achieve the above purpose, the present application provides a method for manufacturing an organic light emitting diode (OLED) display screen, comprising steps of:
providing a first substrate and a second substrate;
disposing the first substrate on an upper surface of a fastener, wherein the fastener is fixed on a side of a surface of the first substrate;
disposing a flexible display module on upper surfaces of the first substrate and the second substrate; and
employing a bending process to the flexible display module, wherein the flexible display module extends and is bent from the upper surface of the first substrate to a bottom surface of the second substrate, and a gap without a filler is provided between the flexible display module and the fastener.

Furtherly, in the step of employing the bending process to the flexible display module, an edge of the second substrate is aligned with an edge of the fastener; and
in a bottom surface of the fastener, a touch panel partially covers a display panel to expose a side of the display panel.

Furtherly, steps after the step of employing the bending process to the flexible display module, wherein the steps include:
adhering a polarizer on an upper surface of the flexible display module;
disposing an optically clear adhesive on an upper surface of the polarizer; and
adhering a cover plate on an upper surface of the optically clear adhesive.

Compared with the prior art, the present application provides an OLED display screen and a method for manufacturing the same, which removes the existing MLC dispensing process and utilizes the flexibility and ductility of the touch panel to extend a length of the touch panel to make it bend and extend from the upper surface of the first substrate to the bottom surface of the second substrate, which can effectively prevent problems such as interference between the glue and other parts in the bending region and wave warping in the bending region, thereby improving the quality of the OLED display screen.

Further, a polarizer is disposed on the touch panel, so that the polarizer only covers the capacitance region of the touch panel, thereby preventing the influence of the touch panel on the capacitance value of the touch panel after bending, so as to improve the yield of the OLED display screen.

BRIEF DESCRIPTION OF DRAWINGS

Hereinafter, in conjunction with the accompanying drawings, the technical solutions and other beneficial effects of the present application will be made obvious by describing the specific implementation manners of the present application in detail.

Figure 1:
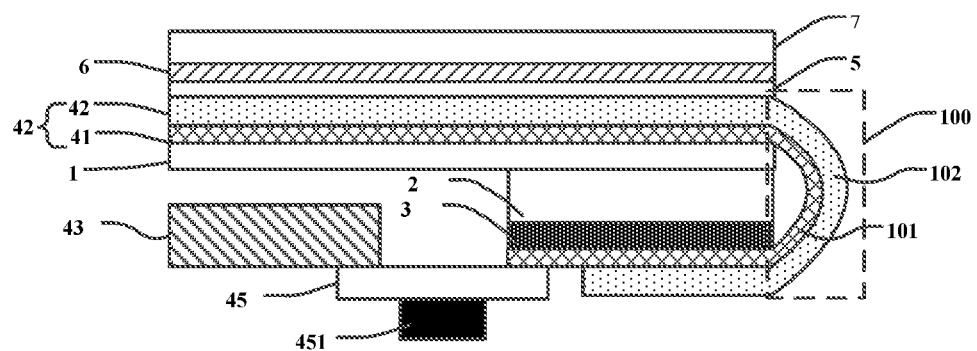
FIG. 1 is a structural schematic diagram of an OLED display screen of an embodiment.

FIGURE ILLUSTRATION 1 first substrate; 2 fastener;
3 second substrate; 4 flexible display module;
5 polarizer; 6 optically clear adhesive; 7 cover plate;
41 display panel; 42 touch panel; 43 touch panel flexible printed circuit;
44 panel flexible printed circuit; 45 chip on film; 451 IC module;
421 capacitance region; 422 drive signal circuit region;
100 bending region; 101 first bending portion; 102 second bending portion.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

In the description of this application, it should be understood that the term "center", "longitudinal", "horizontal", "length", "width", "thickness", "upper", "down", "front", "back", "left", "right", "vertical", "horizontal", "top", "bottom", "inner", "outer", "clockwise", and "anticlockwise" indicates a location or position relations based on the location or position shown in the appended drawings, rather than instructions referred to in or implied devices or components must have a specific location, in a specific orientation structure and operation. Therefore, it cannot be interpreted as a restriction on this application. In addition, the terms "first" and "second" are used for purposes only and cannot be understood to indicate or imply relative importance or to imply the number of technical characteristics indicated. Thus, the characteristics that are defined as "first" or "second" may explicitly or implicitly include one or more of the characteristics. In the description of this application, "multiple" means two or more, unless specifically defined otherwise. In addition, the term "first", "second" is only used for descriptive purposes, and cannot be understood as indicating or implying relative importance or implicitly indicating the number of technical features indicated. Thus, the characteristics that are defined as "first" or "second" may explicitly or implicitly include one or more of the characteristics. In the description of this application, "multiple" means two or more, unless otherwise specifically limited.

In the description of this application, it should be noted that, unless otherwise expressly specified and limited, the terms "installed", "connected" and "connected" shall be understood in a broad sense, for example, as fixed, detachable or one-piece; it can be mechanical, it can be electrical or it can communicate with each other; it can be either directly connected or indirectly connected through an intermediary, or it can be a connection between two elements or an interaction between two elements. For the general technical personnel in this field, the specific meaning of the above terms in this application can be understood according to the specific situation.

In the description of this application, it should be understood that the term "center", "longitudinal", "horizontal", "length", "width", "thickness", "upper", "down", "front", "back", "left", "right", "vertical", "horizontal", "top", "bottom", "inner", "outer", "clockwise", and "anticlockwise" indicates a location or position relations based on the location or position shown in the appended drawings, rather than instructions referred to in or implied devices or components must have a specific location, in a specific orientation structure and operation. Therefore, it cannot be interpreted as a restriction on this application. In addition, the terms "first" and "second" are used for purposes only and cannot be understood to indicate or imply relative importance or to imply the number of technical characteristics indicated. Thus, the characteristics that are defined as "first" or "second" may explicitly or implicitly include one or more of the characteristics. In the description of this application, "multiple" means two or more, unless specifically defined otherwise. In addition, the term "first", "second" is only used for descriptive purposes, and cannot be understood as indicating or implying relative importance or implicitly indicating the number of technical features indicated. Thus, the characteristics that are defined as "first" or "second" may explicitly or implicitly include one or more of the characteristics. In the description of this application, "multiple" means two or more, unless otherwise specifically limited.

In the description of this application, it should be noted that, unless otherwise expressly specified and limited, the terms "installed", "connected" and "connected" shall be understood in a broad sense, for example, as fixed, detachable or one-piece; it can be mechanical, it can be electrical or it can communicate with each other; it can be either directly connected or indirectly connected through an intermediary, or it can be a connection between two elements or an interaction between two elements. For the general technical personnel in this field, the specific meaning of the above terms in this application can be understood according to the specific situation.

As shown in FIG. 1, this embodiment provides an OLED display screen, including a first substrate 1, a fastener 2, a second substrate 3, a flexible display module 4, a polarizer 5, an optically clear adhesive 6, and a cover plate 7.

The fastener 2 is disposed on a side of an upper surface of the first substrate 1. The second substrate 3 is disposed on a bottom surface of the fastener 2 and aligned with an edge of the fastener 2.

In this embodiment, two side surface of the fastener 2 have PET material as adhesives, which are configured to support the first substrate 1 and the second substrate 3, thereby fixing the entire OLED display screen.

The flexible display module 4 extends and is bent from an upper surface of the first substrate 1 to a bottom surface of the second substrate 3, so that the flexible display module 4 is bent to form a bending region 100. Wherein, there is a gap without a filler provided between the flexible display module 4 and the fastener 2.

Specifically, the flexible display module 4 includes a display panel 41 and a touch panel 42, the touch panel 42 is disposed on an upper surface of the display panel 41, and the touch panel 42 does not completely cover the display panel 41.

The display panel 41 is disposed on the first substrate 1, and is bent and extends to a bottom surface of the second substrate 3 to form a first bending portion 101.

The touch panel 42 has a good flexibility and ductility. The touch panel 42 is disposed on a side surface of the display panel 41 far away from the second substrate, and is bent and extends below the fastener 2 along with the display panel 41. On a side of the fastener 2 away from the first substrate 1, the touch panel 42 partially covers the display panel 41 to expose a side of the display panel 41. A thickness of the touch panel 42 is 25-60 μm, preferably 44 μm, 48 μm, 50 μm, 52 μm, 56 μm, so as to prevent excessive stress after the touch panel 42 is bent, which affects a bending effect.

Compared with the prior art, this embodiment removes the existing MLC dispensing process and utilizes the flexibility and ductility of the touch panel to extend a length of the touch panel to make it bend and extend from the upper surface of the first substrate to the bottom surface of the second substrate, which can effectively prevent problems such as interference between the glue and other parts in the bending region and wave warping in the bending region, thereby improving the quality of the OLED display screen.

The polarizer 5 is disposed on the flexible display module 4. A length of polarizer 5 is less than a length of flexible display module 4.

Figure 2:
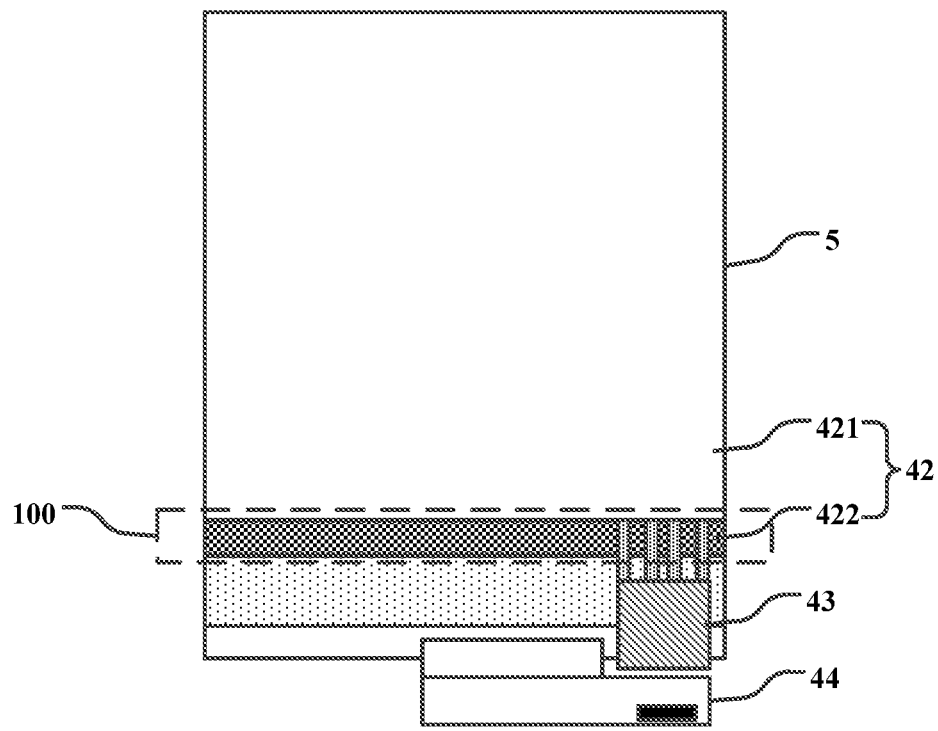
FIG. 2 is a plan view of the OLED display screen of this embodiment.

As shown in FIG. 2, the OLED display screen also includes a touch panel flexible printed circuit 43 (TP FPC) and a panel flexible printed circuit 44 (panel FPC). The touch panel 42 forms a loop with the touch panel flexible printed circuit 43 and the panel flexible printed circuit 44 to realize an electrical connection, so that the OLED display screen realizes functions such as display and touch.

The touch panel 42 includes a capacitance region 421 and a drive signal circuit region 422. Specifically, the polarizer covers the capacitance region 421 of the touch panel 42 to prevent the touch panel 42 from affecting the capacitance value of the touch panel 42 after being bent, to ensure the touch sensitivity of the touch panel 42, thereby improving the yield of the OLED display screen. The drive signal circuit region 422 is bent and extends below the second substrate.

As shown in FIG. 1, the OLED display screen also includes a chip on film 45, and an IC module 451 is provided on the chip on film (COF) 45. The IC module 451 is mostly configured as a source driver and gate driver for display drivers. In the drive circuit, one end of the chip on film 45 is connected to the panel flexible printed circuit 44, and is configured to receive data signals transmitted by the panel flexible printed circuit 44, and the other end of the COF is connected to the display panel 41, and is configured to transmit data signals output by the IC to the display panel, and to drive the display panel to display.

In this embodiment, the OLED display screen further includes an optically clear adhesive 6 and a cover plate 7. The optically clear adhesive is disposed between the polarizer 5 and the cover plate 7, and is for the polarizer 5 and the cover plate 7.

This embodiment provides an OLED display screen, which removes the existing MLC dispensing process and utilizes the flexibility and ductility of the touch panel to extend a length of the touch panel to make it bend and extend from the upper surface of the first substrate to the bottom surface of the second substrate, which can effectively prevent problems such as interference between the glue and other parts in the bending region and wave warping in the bending region, thereby improving the quality of the OLED display screen.

Further, the polarizer is set on the touch panel, and the polarizer only covers the capacitance region of the touch panel, thereby preventing the influence of the touch panel on the capacitance value of the touch panel after bending, so as to improve the yield of the OLED display screen.

Figure 3:
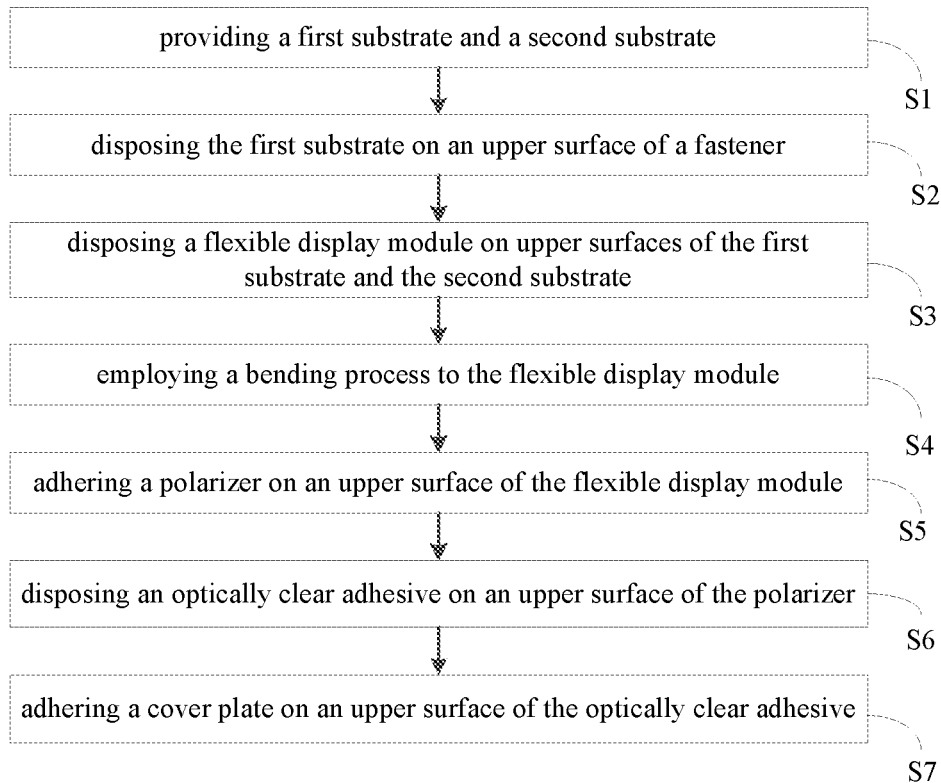
FIG. 3 is a flowchart of the OLED display screen of this embodiment.

As shown in FIG. 3, this embodiment also provides a method for manufacturing an OLED display screen, including the following steps S1-S7.

A step S1 of providing a first substrate and a second substrate.

A step S2 of disposing the first substrate on an upper surface of a fastener, wherein the fastener is disposed on a side of a surface of the first substrate.

A step S3 of setting a flexible display module on upper surfaces of the first substrate and the second substrate.

Figure 4:
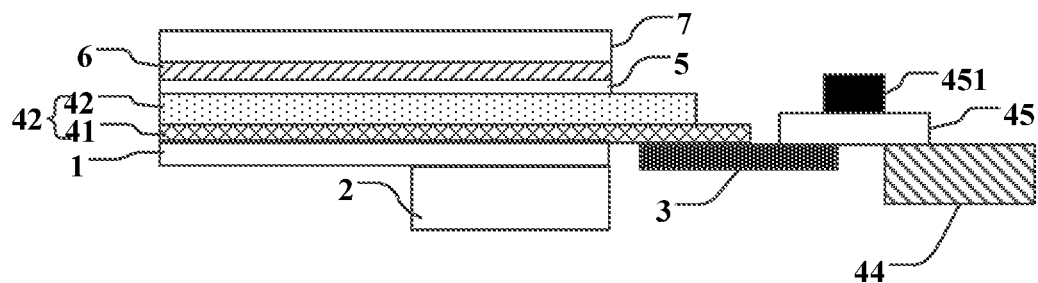
FIG. 4 is a structural schematic diagram of a flexible display module according to this embodiment before bending.

As shown in FIG. 4, the flexible display module 4 includes a display panel 41 and a touch panel 42, the touch panel 42 is disposed on the upper surface of the display panel 41, and the touch panel 42 does not completely cover the display panel 41. The upper surface of the display panel 41 that is not covered by the touch panel 42 is connected to the chip on film 45, and an IC module 451 is disposed on the chip on film 45. Specifically, in the driving circuit, one end of the chip on film 45 is connected to the panel flexible printed circuit 44 to receive data signals transmitted from the panel flexible printed circuit 44, and the other end of the COF is connected to the display panel 41 to transmit data signals output by the IC to the display panel to drive the display panel to display.

A step of S4 of employing a bending process to the flexible display module, wherein the flexible display module extends and is bent from the upper surface of the first substrate to a bottom surface of the second substrate, and a gap without a filler is provided between the flexible display module and the fastener, and an edge of the second substrate is aligned with an edge of the fastener.

Figure 5:
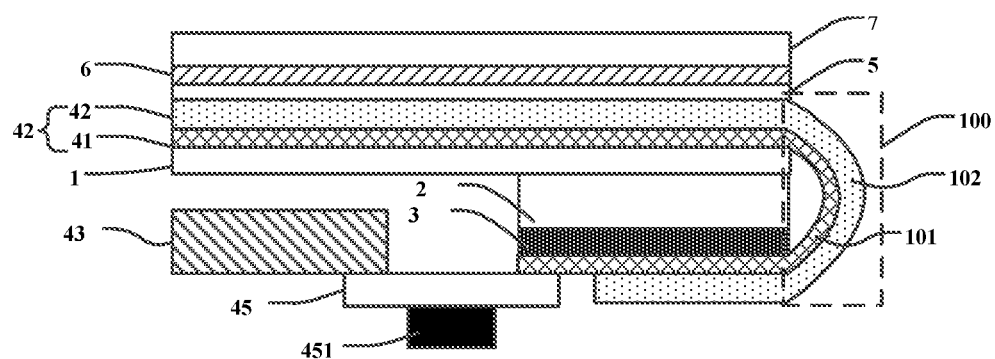
FIG. 5 is a structural schematic diagram of the flexible display module according to this embodiment after bending.

As shown in FIG. 5, the flexible display module 4 extends and is bent from the upper surface of the first substrate 1 to the bottom surface of the second substrate 3, so that the flexible display module 4 is bent to form a bending region 100. There is a gap without a filler provided between the flexible display module 4 and the fastener 2.

Specifically, the display panel 41 is disposed on the first substrate 1, and is bent and extends to the bottom surface of the second substrate 3 to form a first bending portion 101. The display panel 41 is fixed on the bottom surface of the fastener 2 and aligned with the edge of the fastener 2.

The touch panel 42 has a good flexibility and ductility. The touch panel 42 is disposed on a side surface of the display panel 41 far away from the second substrate, and is bent and extends below the fastener 2 along with the display panel 41. On a side of the fastener 2 away from the first substrate 1, the touch panel 42 partially covers the display panel 41 to expose a side of the display panel 41. A thickness of the touch panel 42 is 25-60 μm, preferably 44 μm, 48 μm, 50 μm, 52 μm, 56 μm, so as to prevent excessive stress after the touch panel 42 is bent, which affects a bending effect.

In this embodiment, two side surface of the fastener have PET material as adhesives, which are configured to support the first substrate 1 and the second substrate 3, thereby fixing the entire OLED display screen.

Compared with the prior art, this embodiment removes the existing MLC dispensing process and utilizes the flexibility and ductility of the touch panel to extend a length of the touch panel to make it bend and extend from the upper surface of the first substrate to the bottom surface of the second substrate, which can effectively prevent problems such as interference between the glue and other parts in the bending region and wave warping in the bending region, thereby improving the quality of the OLED display screen.

A step S5 of adhering a polarizer on an upper surface of the flexible display module.

The polarizer 5 is disposed on the flexible display module 4, referring to FIG. 5. A length of polarizer 5 is less than a length of flexible display module 4.

A step S6 of disposing an optically clear adhesive 6 on an upper surface of the polarizer 5, referring to FIG. 5.

A step S7 of adhering a cover plate 7 to an upper surface of the optically clear adhesive 6. The optically clear adhesive is configured to bond the polarizer and the cover plate.

This embodiment provides an OLED display screen, which removes the existing MLC dispensing process and utilizes the flexibility and ductility of the touch panel to extend a length of the touch panel to make it bend and extend from the upper surface of the first substrate to the bottom surface of the second substrate, which can effectively prevent problems such as interference between the glue and other parts in the bending region and wave warping in the bending region, thereby improving the quality of the OLED display screen.

Further, the polarizer is set on the touch panel, and the polarizer only covers the capacitance region of the touch panel, thereby preventing the influence of the touch panel on the capacitance value of the touch panel after bending, so as to improve the yield of the OLED display screen.

In the above embodiments, the description of each embodiment has its own emphasis. For a part that is not detailed in an embodiment, you can refer to the related descriptions of other embodiments.

The above provides a detailed introduction to an OLED display screen and a method for manufacturing the same provided by the embodiments of the present application. Specific examples are used in this article to illustrate the principles and implementations of the present application. The description of the above embodiments is only used to help understanding The technical solutions of this application and its core ideas; those of ordinary skill in the art should understand that: they can still modify the technical solutions recorded in the foregoing embodiments, or equivalently replace some of the technical features; and these modifications or replacements It does not cause the essence of the corresponding technical solutions to deviate from the scope of the technical solutions of the embodiments of the present application.

What is claimed is:

1. An organic light emitting diode (OLED) display screen, comprising:
   a first substrate;
   a fastener disposed on a side of a surface of the first substrate;
   a second substrate disposed on a surface of the fastener far away from the first substrate; and
   a flexible display module extending and bent from a surface of the first substrate far away from the fastener to a surface of the second substrate far away from the fastener, wherein a gap without a filler is provided between the flexible display module and the fastener;
   wherein the first substrate and the second substrate do not bend;
   wherein the flexible display module comprises:
   a display panel disposed on the first substrate, and bent and extending to a bottom surface of the second substrate; and
   a touch panel disposed on a surface of the display panel far away from the second substrate;
   wherein at a side of the fastener far away from the first substrate, the touch panel partially covers the display panel to expose a part of the surface of the display panel, and an edge of the touch panel is not aligned with an edge of the display panel; and
   wherein the OLED display screen further comprises a chip on film, one end of the chip on film is connected to a panel flexible printed circuit to receive data signals transmitted from the panel flexible printed circuit, and another end of the chip on film is connected to the display panel to transmit data signals to the display panel.

2. The OLED display screen of claim 1, wherein a thickness of the touch panel is 25-60 μm.

3. The OLED display screen of claim 1, further comprising:
   a polarizer disposed on the flexible display module;
   wherein a length of the polarizer is less than a length of the flexible display module.

4. The OLED display screen of claim 3, wherein a touch panel comprises:
   a capacitance region covered by the polarizer; and
   a drive signal circuit region bent and extending below the second substrate.

5. The OLED display screen of claim 3, further comprising:
   an optically clear adhesive disposed on a surface of the polarizer far away from the second substrate; and
   a cover plate covering a surface of the optically clear adhesive far away from the second substrate.

6. The OLED display screen of claim 1, wherein an edge of the second substrate is aligned with an edge of the fastener.

7. A method for manufacturing an organic light emitting diode (OLED) display screen, comprising steps of:
   providing a first substrate and a second substrate;
   disposing the first substrate on an upper surface of a fastener, wherein the fastener is fixed on a side of a surface of the first substrate;
   disposing a flexible display module on upper surfaces of the first substrate and the second substrate;
   employing a bending process to the flexible display module, and the flexible display module extends and is bent from the upper surface of the first substrate to a bottom surface of the second substrate, and a gap without a filler is provided between the flexible display module and the fastener;
   wherein the flexible display module comprises:
   a display panel disposed on the first substrate, and bent and extended to a bottom surface of the second substrate; and a touch panel disposed on a surface of the display panel far away from the second substrate;

wherein at a side of the fastener far away from the first substrate, the touch panel partially covers the display panel to expose a part of the surface of the display panel, and an edge of the touch panel is not aligned with an edge of the display panel; and wherein the OLED display screen further comprises a chip on film, one end of the chip on film is connected to a panel flexible printed circuit to receive data signals transmitted from the panel flexible printed circuit, and another end of the chip on film is connected to the display panel to transmit data signals to the display panel.

8. The method for manufacturing the OLED display screen of claim 7, wherein in the step of employing the bending process to the flexible display module, an edge of the second substrate is aligned with an edge of the fastener; and at a bottom surface of the fastener, a touch panel partially covers a display panel to expose a side of the display panel.

9. The method for manufacturing the OLED display screen of claim 7, further comprising steps after the step of employing the bending process to the flexible display module, wherein the steps comprise:

adhering a polarizer on an upper surface of the flexible display module;

disposing an optically clear adhesive on an upper surface of the polarizer; and adhering a cover plate on an upper surface of the optically clear adhesive.

* * * * *